(12) United States Patent
Caldwell et al.

(10) Patent No.: US 9,681,214 B2
(45) Date of Patent: *Jun. 13, 2017

(54) INTEGRATED EARBUD ANTENNA FOR RECEIVING TELEVISION BROADCASTS

(71) Applicant: Fox Digital Enterprises, Inc., Los Angeles, CA (US)

(72) Inventors: M. Winston Caldwell, Los Angeles, CA (US); Robert Evans Wetmore, Manhattan Beach, CA (US)

(73) Assignee: Fox Digital Enterprises, Inc., Los Angeles, CA (US)

( * ) Notice: Subject to any disclaimer, the term of this patent is extended or adjusted under 35 U.S.C. 154(b) by 155 days.

This patent is subject to a terminal disclaimer.

(21) Appl. No.: 14/557,309

(22) Filed: Dec. 1, 2014

(65) Prior Publication Data

US 2015/0086032 A1 Mar. 26, 2015

Related U.S. Application Data

(63) Continuation of application No. 13/540,444, filed on Jul. 2, 2012, now Pat. No. 8,903,102.

(51) Int. Cl.
*H04R 1/10* (2006.01)
*H02B 1/00* (2006.01)
*H03J 5/24* (2006.01)

(52) U.S. Cl.
CPC .......... *H04R 1/1091* (2013.01); *H03J 5/244* (2013.01); *H04R 2201/109* (2013.01); *H04R 2420/07* (2013.01)

(58) Field of Classification Search
CPC ........ H04R 5/033; H04R 5/04; H04R 1/1041; H04R 2420/03; H04R 1/1091; H04N 5/50; H04N 5/60; H04N 5/605; H04N 5/607; H01Q 1/52; H01Q 1/27; H01Q 1/273; H01Q 1/276; H04M 1/6058; H04M 1/6066; H04M 1/05; H04B 1/385
USPC ..... 381/74, 309, 311, 79, 81, 123, 370, 384; 348/731, 736, 738; 343/718, 720; 455/575.2, 575.5, 575.7
See application file for complete search history.

(56) References Cited

U.S. PATENT DOCUMENTS

| | | | |
|---|---|---|---|
| 4,369,521 A | 1/1983 | Sawada | |
| 5,483,367 A | 1/1996 | Han | |
| 7,340,285 B2 | 3/2008 | Yoshino | |
| 7,373,169 B2 | 5/2008 | Yoshino | |
| 7,559,803 B2 | 7/2009 | Mukai et al. | |
| 7,701,398 B2 | 4/2010 | Korner | |
| 7,787,574 B2 | 8/2010 | Mori et al. | |
| 7,840,242 B2 | 11/2010 | Yoshino | |
| 7,907,095 B2 | 3/2011 | Kimura et al. | |

(Continued)

FOREIGN PATENT DOCUMENTS

| CN | 101064795 | 10/2007 |
|---|---|---|
| CN | 201038302 | 3/2008 |

(Continued)

*Primary Examiner* — Xu Mei
(74) *Attorney, Agent, or Firm* — Gates & Cooper LLP

(57) ABSTRACT

A method and apparatus for adapting an electronic device to receive digital television broadcast signals is disclosed. The device comprises a switch commandable to interpose one or more matching networks as in the RF signal path according to a channel command to match an integrated headset antenna to the tuner receiving the RF signals.

25 Claims, 9 Drawing Sheets

(56) References Cited

U.S. PATENT DOCUMENTS

| | | |
|---|---|---|
| 7,911,401 B2 | 3/2011 | Yoshino et al. |
| 7,944,399 B2 | 5/2011 | Harano |
| 8,237,623 B2 | 8/2012 | Hung |
| 8,243,958 B2 | 8/2012 | Kimura et al. |
| 8,259,029 B2 | 9/2012 | Abdelgany et al. |
| 8,588,717 B2 | 11/2013 | Caimi |
| 8,903,102 B2 * | 12/2014 | Caldwell ............ H03J 5/244 343/718 |
| 2008/0170739 A1 | 7/2008 | Suematsu et al. |
| 2009/0033575 A1 | 2/2009 | Dybdal et al. |
| 2009/0257607 A1 | 10/2009 | Abdelgany et al. |
| 2011/0116643 A1 | 5/2011 | Tiscareno et al. |
| 2012/0106770 A1 | 5/2012 | Tsai et al. |
| 2012/0121102 A1 | 5/2012 | Jang |
| 2012/0188462 A1 | 7/2012 | Lynn et al. |
| 2013/0222702 A1 | 8/2013 | Wu et al. |

FOREIGN PATENT DOCUMENTS

| | | |
|---|---|---|
| EP | 1971179 | 9/2008 |
| GB | 2442032 | 3/2008 |
| JP | 59089004 | 6/1984 |
| JP | 20033274477 | 9/2003 |
| JP | 2006196977 | 7/2006 |
| JP | 2006287720 | 10/2006 |
| JP | 2006338957 | 12/2006 |
| JP | 2007110503 | 4/2007 |
| JP | 2007235192 | 9/2007 |
| JP | 2010056850 | 3/2010 |
| KR | 20100082646 | 7/2010 |
| WO | 2006/081260 | 8/2006 |

* cited by examiner

INTEGRATED EARBUD ANTENNA FOR RECEIVING TELEVISION BROADCASTS

This application is a continuation of U.S. patent application Ser. No. 13/540,444, entitled "INTEGRATED EARBUD ANTENNA FOR RECEIVING TELEVISION BROADCASTS," by M. Winston Caldwell and Robert Evans Wetmore, filed Jul. 2, 2012, issued as U.S. Pat. No. 8,903,102, which application is hereby incorporated by reference herein.

BACKGROUND OF THE INVENTION

1. Field of the Invention

The present invention relates to systems and methods for receiving broadcasts via electromagnetic waves, and in particular to an integrated earbud antenna for receiving digital broadcasts and a method for using same.

2. Description of the Related Art

Recent years have witnessed the proliferation of portable devices including smart phones such as an ANDROID phone and an IPHONE, tablet computers such as the IPAD, media players such as the IPOD and IPOD touch, as well as laptops and netbooks.

Such devices are capable of receiving a wide variety of media programs and programming from a variety of sources via the Internet from sources such as NETFLIX and HULU. However, currently, live media programs are not available using such devices, because the rights to transmit such programming are not licensed for Internet distribution. Such programs are instead broadcast by terrestrial transmission systems with transmitters deployed where service is desired.

Accordingly, there is a need for an apparatus and method that allows portable devices to receive live broadcasts from terrestrial transmission systems. The present invention satisfies this need.

SUMMARY OF THE INVENTION

To address the requirements described above, a method and apparatus for adapting an electronic device to receive broadcast television signals is disclosed. The apparatus may be embodied in an adapter, removably coupleable to an electronic device having a device processor to receive a digital television within a first legacy band or a second legacy band. This adapter may comprise a headset, having a first earbud for producing audio according to a first input signal and a second earbud for producing audio according to a second input signal. The adapter may further comprise a first signal conductor communicatively coupled to a first earbud input and the first input signal, a second signal conductor communicatively coupled to a second earbud first input and the second input signal, a common conductor communicatively coupled to a first earbud ground and a second earbud ground, an isolation circuit, coupled between an audio amplifier output and the first earbud input and the second earbud input, the isolation circuit for blocking the RF television frequency signals from the audio amplifier while passing audio frequency signals from the audio amplifier, and a switch, having an signal input, a control input, a first signal output and a second signal output, wherein the signal input is coupled to one of the first signal conductor and the common conductor and the switch communicatively couples the signal input to either the first signal output or the second signal output according to the control input. The adapter may also comprise a passive or active first legacy frequency band matching network communicatively coupled between the first signal output and a first input of a tuner, a passive or active second legacy frequency band matching network communicatively coupled to the second signal output and a second input of the tuner, and an adapter processor, communicatively coupled to the switch control input, for generating a switch command according to a channel command received from the device processor. In one embodiment, the first legacy frequency band matching network matches the input impedance of the first tuner input with the output impedance of the switch and the second legacy frequency band matching network matches the input impedance of the second tuner input with the output impedance of the switch.

In another embodiment, the adapter is removably coupleable to an electronic device having a device processor to adapt the electronic device to receive a television signal within a first legacy frequency band or a second legacy frequency band, and comprises a headset, comprising a first earbud coupled to a first signal conductor and coupled to a common conductor; an audio amplifier, coupled to the first earbud via an optional isolation circuit to the first signal conductor; a switch, coupled between one of the first signal conductor and the common conductor and a tuner, the switch for selectably coupling the one of the first signal conductor and the common signal conductor to a tuner via one of a plurality of networks comprising a first network and a second network according a switch command. In this embodiment, the first network matches a first output impedance of the switch to a first impedance into the tuner over the first legacy frequency band, and the second network matches the second output impedance of the switch to a second input impedance of the tuner over a second legacy frequency band.

In still another embodiment, the invention is embodied in a method of adapting an electronic device to receive an RF television signal within a first legacy frequency band and a second legacy frequency band. The method may comprise the steps of accepting a channel command from the electronic device in an adapter removably communicatively coupleable to the electronic device, the adapter having a headset comprising a first earbud coupled to a first signal conductor and coupled to a common conductor, providing the RF television signal from one of the first signal conductor and the common conductor to a first matching network or a second matching network, the application of the RF television signal to the first matching network or the second matching network selected according to the channel command, and providing the RF television signal from the selected matching network to a tuner. In this embodiment, the first network matches a first impedance out of one of the first signal conductor and the common conductor to a first impedance into the tuner over the first legacy frequency band and the second network matches the first impedance out of the one of the first signal conductor and the common conductor to a first impedance into the tuner over the second legacy frequency band.

BRIEF DESCRIPTION OF THE DRAWINGS

Referring now to the drawings in which like reference numbers represent corresponding parts throughout.

DETAILED DESCRIPTION OF PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Figure 1:
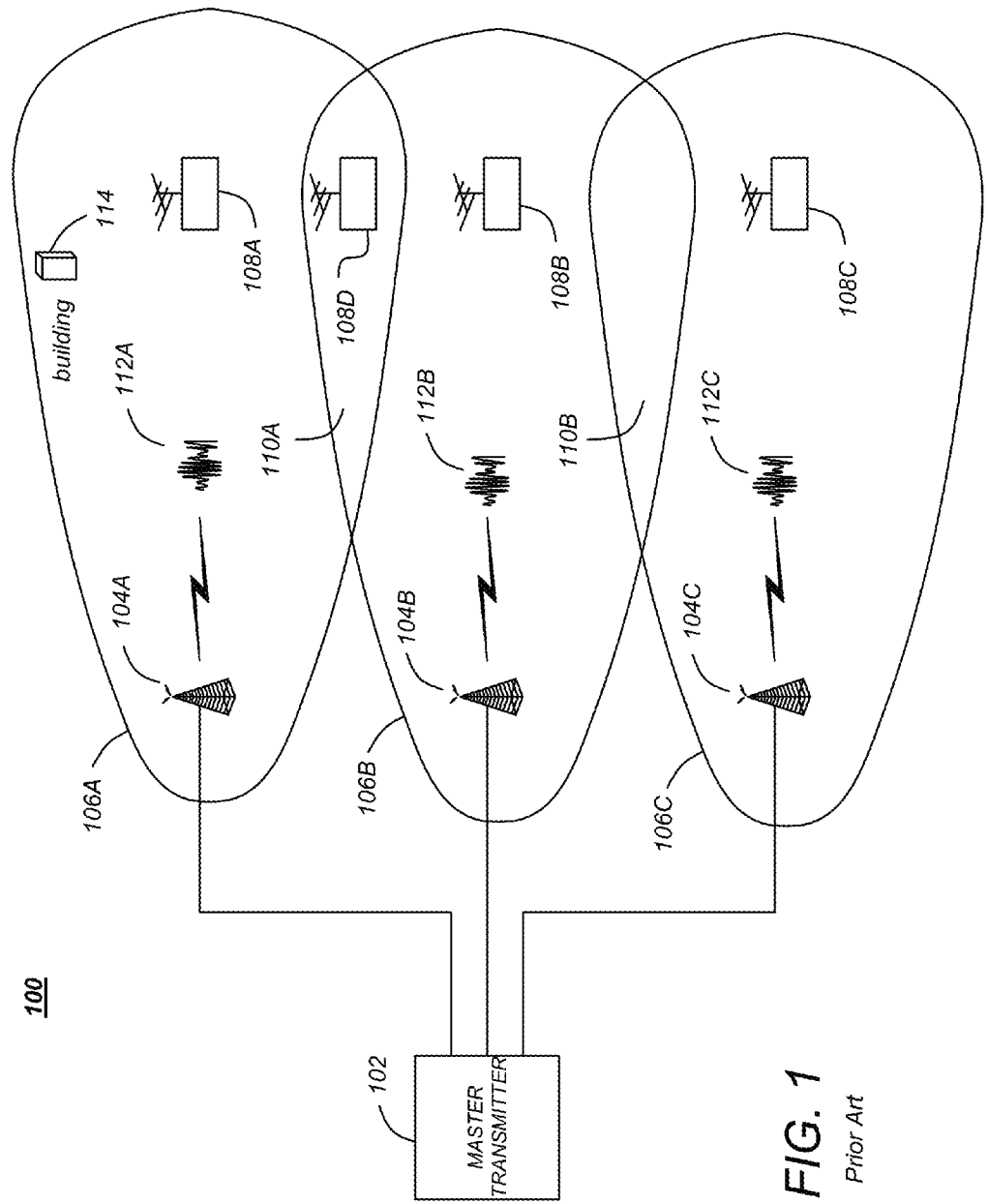
FIG. 1 is a diagram of a digital transmission system.

FIG. 1 is a diagram of a digital transmission system 100. The transmission system 100 includes a master transmitter 102 that is communicatively coupled to a plurality of secondary transmitters 104A-104C (hereinafter alternatively referred to as transmitter(s) 104). The master transmitter 102 may be communicatively coupled with transmitters 104 via a wireless link (including radio frequency (RF), intermediate frequency (IF), microwave, optical frequencies) or a wired link. Wireless communications may be via terrestrial transmission, airborne transmission or by satellite. Further, communications with one of the transmitters 104 may be wireless, while communications with another one of the transmitters 104 may be wired.

The transmitters 104 receive a signal comprising information such as a media program and advertisements from the master transmitter 102 and retransmit the received signal to receiver stations 108A-108D (hereby alternatively referred to as receiver station(s) 108).

The receiver stations 108 may be embodied by any device capable of receiving and the signals from the secondary transmitters 104, and processing them for display, including for example television receivers, set-top boxes, cellphones, personal computers or laptop computers. Each of the transmitters 104 transmits provides a transmitted signal 112A-112C (hereinafter alternatively referred to as transmitted signal(s) 112) in coverage areas 106A-106C (hereinafter alternatively referred to as coverage area(s) 106).

The true coverage area 106 of the transmitters 104 is not as simple as depicted. The actual coverage area 106 will depend on time varying characteristics such as weather, the performance characteristics of the receiver stations 108, and external blockage factors such as opaque or reflective objects 114 preventing signal passage or direct signals where they are not desired. For example, during periods of extreme weather, coverage areas 106 may be substantially reduced in size, and buildings may reflect signal to undesired areas. Coverage areas 106 include overlapping coverage areas 110A-110B (hereinafter alternatively referred to as overlapping coverage area(s) 110. Receiver stations 108 in overlapping areas (for example, receiver station 108D) may have difficulty receiving a signal because signal provided by transmitter 104A is interfered with by the signal from transmitter 104B.

Interference can be from many sources, including multipath from radio signal reflections from stationary or moving objects 114, signals 112A and 112B from nearby transmitters arriving at the receiver station 108 at different times. One problem is that the carrier of the first signal 112A will not be in phase with the carrier of the second signal 112B, compromising the demodulation of the signal at the receiver station 108. Another problem is that the data itself from the different transmitters 104 do not arrive at the receiver station 108 at the same time, thus causing reception difficulties.

The foregoing problems can be ameliorated if the receiver station 108 includes a suitable antenna that is configured to receive desired signals and reject undesired signals.

Figure 2:
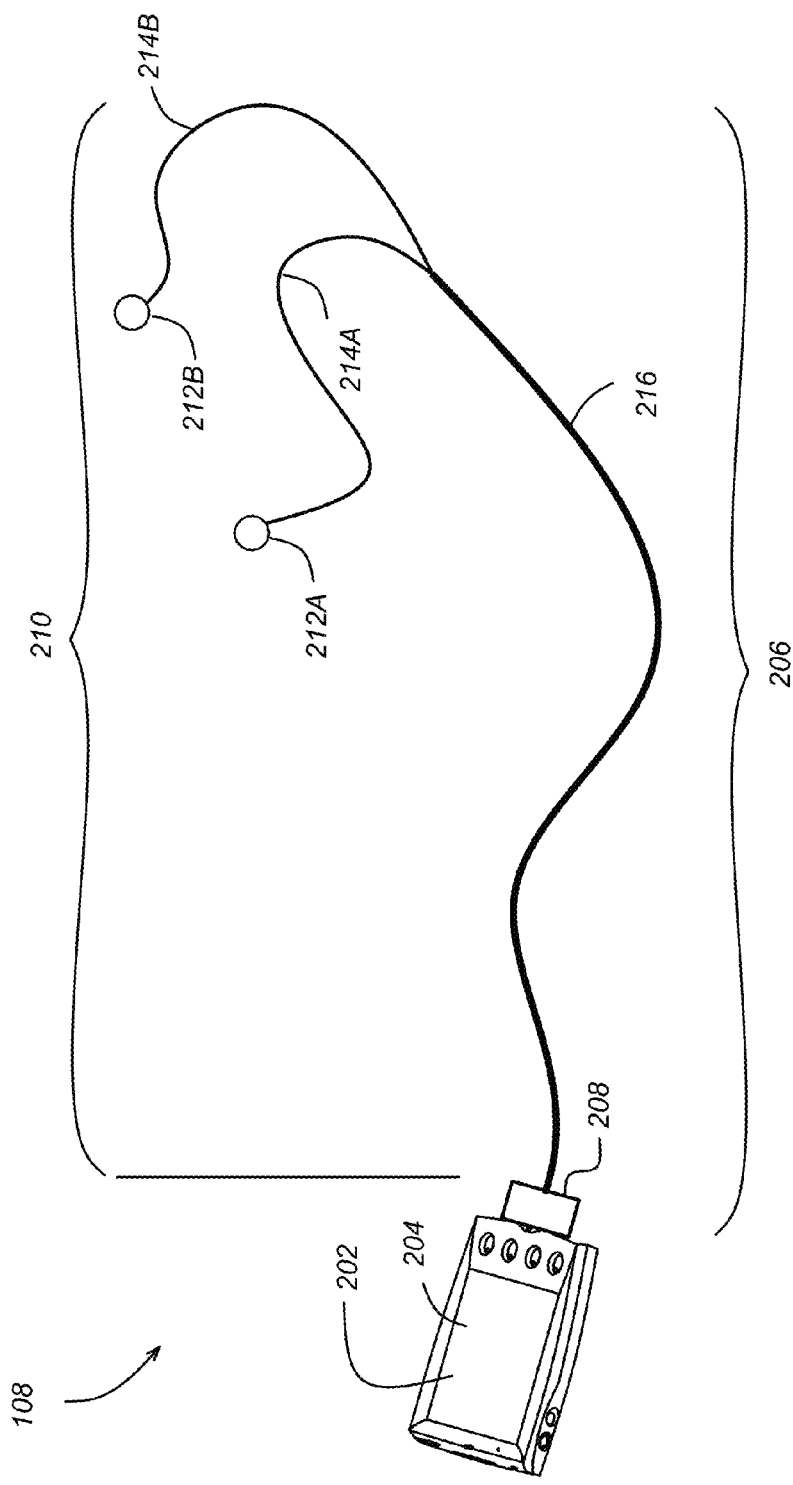
FIG. 2 is a diagram of a mobile receiver station.

FIG. 2 is a diagram of a mobile receiver station 108. The receiver station 108 comprises a mobile electronic device 202 for presenting media programs and other information on a display 204. The mobile electronic device 202 may comprise a cellphone; a smart phone; a personal data assistant (PDA); a portable media player such as an IPOD, IPOD TOUCH, or other MP3 player; a tablet computer such as an IPAD, a netbook computer or a laptop computer.

The receiver station 108 also comprises an adapter 206. The adapter 206 is removably coupleable to the electronic device 202. The adapter 206 comprises coupler 208 and a headset 210 communicatively coupled to the coupler 208. In one embodiment, the coupler 208 comprises electrical contacts that interface with matching electrical contacts of the electronic device 202 when the electronic device and coupler 208 are coupled together, so that the electronic device 202 and coupler 208 can transmit and receive data and commands, and optionally, power. Typically, power is provided to the adapter 208 from the electronic device 202, but the adapter 206 may also include an internal battery to perform the functions of the adapter 206 and also provide power to the electronic device 202, for example, when the battery internal to the electronic device 202 is exhausted.

The headset 210 comprises a first sound reproduction device 212A and a second sound reproduction device 212B (hereinafter alternatively referred to as sound reproduction device(s) 212 or earbuds 212). The first earbud 212A is communicatively coupled to the adapter 208 via first pair of conductors 214A and combined conductor 216. The second earbud 212B is communicatively coupled to the adapter 208 via a second pair of conductors 214B and the combined conductor 216. The sound reproduction devices 210 produce audio according to input signals provided by signal conductors 434R, 434L, and common or ground conductor 434G as further described herein with respect to FIGS. 4-7, as described below.

The sound reproduction devices 210 may comprise earbuds that are placed within the ear canal of the user, earphones that are attached to the external ear, or headphones. The sound reproducing element is typically dynamic (with sound being reproduced by a membrane, voice coil and magnet assembly) or any other design which transforms electrical energy into sound energy.

Figure 3:
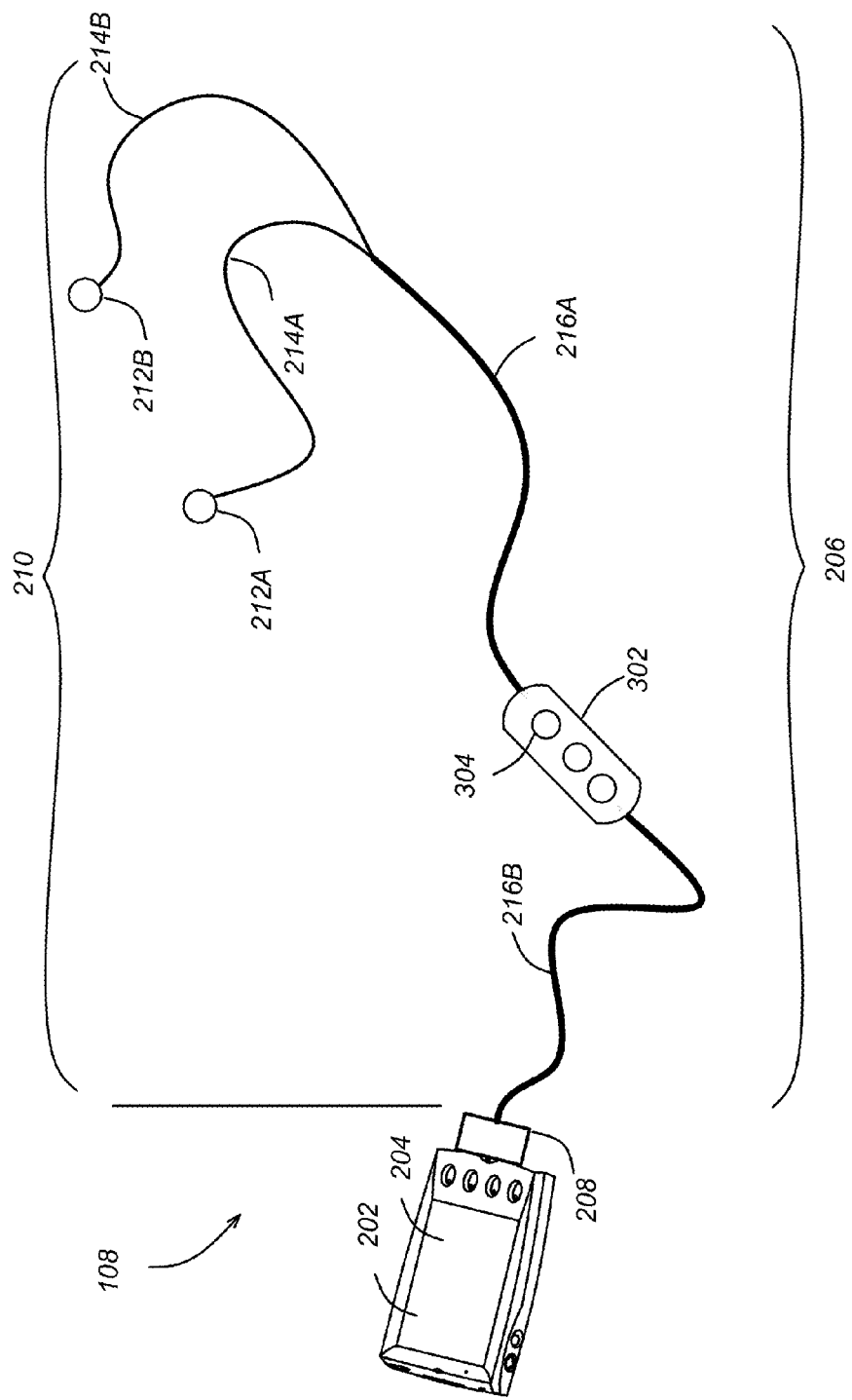
FIG. 3 is a diagram presenting an alternative embodiment of the adapter.

FIG. 3 is a diagram presenting an alternative embodiment of the adapter 210. In this embodiment, the adapter includes a control unit 302 that includes user input I/O devices 304. These devices permit the user to adjust the volume of the audio signals presented at the earbuds 212, may allow the user to change channels to tune different digital television stations, as well as other functions. Also in this embodiment, the combined conductor 216 may be segmented into two portions, including first combined conductor portion 216A and second combined conductor portion 216B. The length of the first combined conductor portion 216A and the second combined conductor portion 216B may differ, with one portion used to receive RF signals in a first RF band, and another portion used to receive RF signals in a second RF band.

Figure 4:
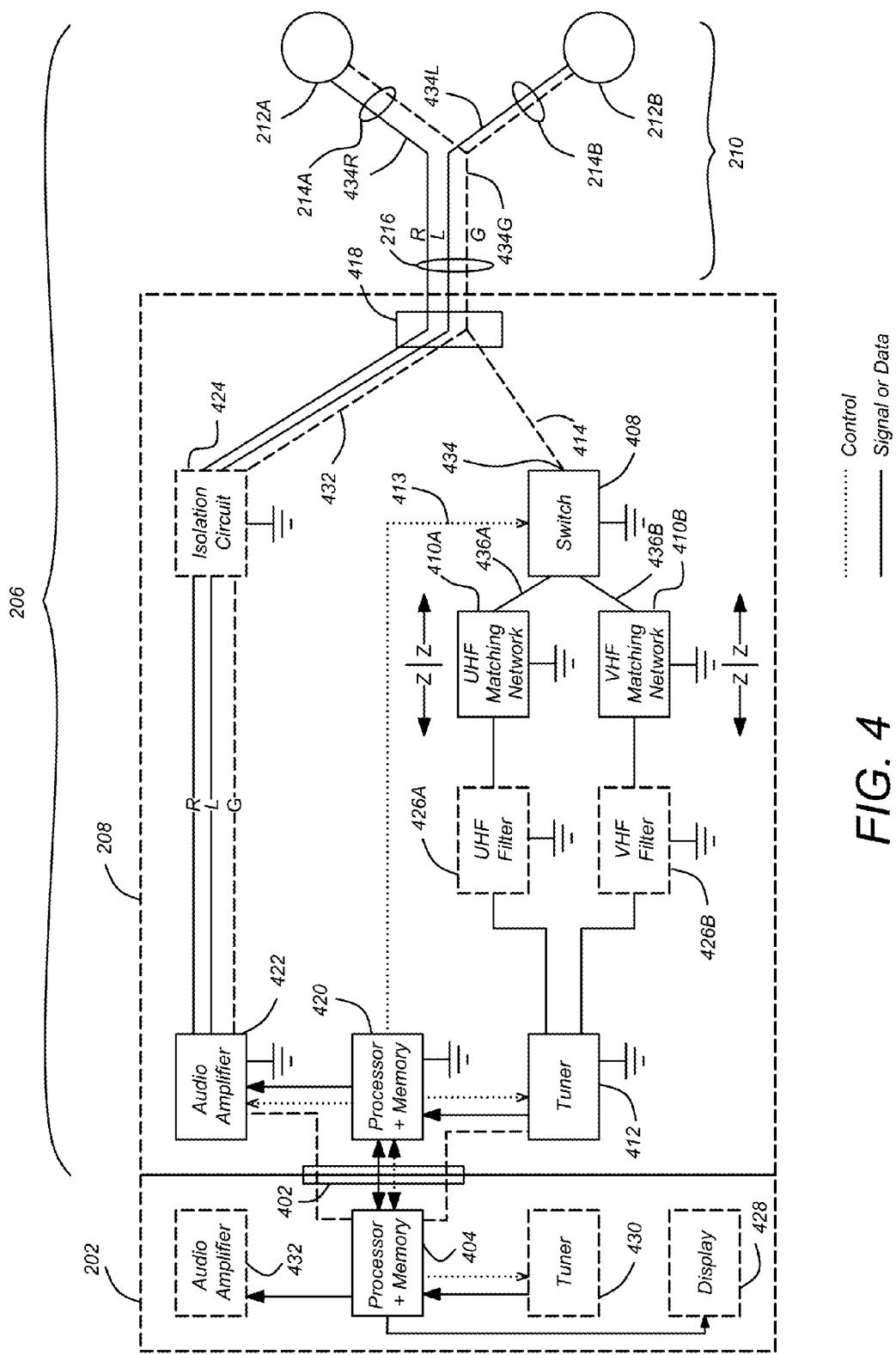
FIG. 4 is a diagram illustrating a hardware embodiment of the adapter.

FIGS. 4-7 are diagrams illustrating hardware embodiments of the adapter 206. Turning first to FIG. 4, the electronic device 202 typically comprises a processor and associated communicatively coupled memory 404. The memory stores instructions that are executed by the processor and data that is used by the processor to perform the functions of the electronic device 202. Hereinafter, the electronic device processor and communicatively coupled electronic device memory will be referred to as the electronic device processor 404.

The electronic device 202 may also comprise reproducing device 428 to accept data and/or instructions from the communicatively coupled electronic device processor 404 to reproduce the media presented by the electronic device 202. In a typical embodiment, the reproducing device 428 comprises a display such as an LCD display for presenting visual information.

Alternatively or in addition to the foregoing, a display may be provided in the adapter 206 or external to both the adapter 206 and the electronic device 202.

The display 428 may also accept user input. For example, the display 428 may be a touch screen display that accepts user commands and data and provide the commands and data to the electronic device processor 404. The electronic device 202 may also comprise one or more I/O devices such as switches that are coupled to the electronic device processor 404.

The electronic device 202 may also comprise an electronic device audio amplifier 432 communicatively coupled to the electronic device processor 404 to accept audio signals from the electronic device processor 404 and amplify them so as to be suitable for use in a speaker built in to the electronic device 202 (not illustrated), or an externally applied and communicatively coupled headphone or other device such as the headset 210. The electronic device 202 may also comprise an electronic device tuner 430 for receiving broadcast media programs, with the electronic device tuner 430 providing the media program data or signals to the electronic device processor 404 for eventual display. The electronic device processor 404 may also provide data or commands to the electronic device tuner 430 such as channel selection commands.

The electronic device 202 communicates signals, data and/or power from/to the adapter 208 via a docking connector interface 402. In one embodiment the connector interface 402 comprises a 30-pin iPOD docking interface connector, such as a MFI512S0017 connector, which permits power and data to be exchanged. Other connector interfaces compatible with similar devices may be implemented, including those compatible with ANDROID devices, a USB or mini-USB connector. Such connectors may be serial or parallel.

The adapter 206 comprises an adapter processor and memory 320. Although illustrated as a single device, the adapter processor and memory 420 may be separate devices. The adapter memory stores instructions and data used by the adapter processor to perform the functions described herein. Hereinafter, the adapter processor and memory will be referred to as the adapter processor 420.

The adapter processor 420 is communicatively coupled to the connector interface 402, and thus, can communicate (transmit and/or receive) data and commands from the electronic device processor 404 to perform the tasks described herein. The adapter 208 may also comprise a tuner 412 that is communicatively coupled to the adapter processor 420 to accept commands (for example, channel selection commands) and provide data or signals to the adapter processor 420. The adapter tuner 412 may also be communicatively coupled to the electronic device processor 404 to accept commands and provide data, either through the adapter processor 420 or through a separate communication path, as illustrated by the dashed line.

The adapter 206 may also comprise an audio amplifier 422 for amplifying audio signals received from the adapter processor 420 or electronic device processor 404. The adapter processor 420 may also provide commands (e.g. volume control) to the adapter 422 audio amplifier.

As described above, the adapter 206 also comprises a headset 210 comprising earbuds 212A and 212B (alternatively referred to hereinafter as earbud(s) 212) connected to the coupler 208 via conductor pairs 214A and 214B and combined conductor 216. As further illustrated in FIG. 4, the first conductor pair 214A includes a common conductor 434G and a first (or right) signal conductor 434R, and the second signal conductor pair 214B includes the common conductor 434G and a second (or left) signal conductor 434L. The common conductors from each earbud 212 are typically combined into a single common conductor that is provided with the right signal conductor 434R and the left signal conductor 434L forming the combined conductor 216. The combined conductor 216 is communicatively coupled to the coupler 208. In one embodiment, combined conductor 216 is removably coupleable to the coupler 208, for example, using a plug such as a coaxial three-conductor plug 418 or similar device.

As described above, there is difficulty in adapting an electronic device to receive broadcasted analog or digital media programs. One of the problems associated with such reception is the provision of an antenna of suitable characteristics in a convenient form. Extendable whip antennas may provide this function, but are inconvenient for mobile use, and are easily broken. Wire-based dipole and folded dipole antennas can be used, but like the extendable whip antennas, they must be of suitable dimension and suitable electrical characteristics for the transmission frequencies of interest.

The adapter 206 uses one or both of the signal conductors 434 and/or the common conductor 434G of the headset 210 as an antenna to receive broadcasts. This is possible because the frequency spectrum of the audio signal(s) being passed from the audio amplifier 422 to the earbud(s) 212 is substantially different than the frequency spectrum of the radio frequency signals sensed by the conductors 434 of the headset 210. The audio signals generally extend between 20 Hz to 20 KHz, while the frequencies of the RF signals extend into the MHz range.

In a first embodiment of the invention shown in FIG. 4, the common conductor 434G is used to collect RF television signals and provide them to the tuner 412. The tuner 412 receives the RF television signals and provides the received signals to the adapter processor 420. The adapter processor 420 provides the received signals to the electronic device processor 202 via connector 402, and the electronic device processor 404 provides the received signals to output devices such as display 428 and/or audio amplifier 422 or 432 so that the user can enjoy the media program embodied in the received RF signals.

Functional allocation among the modules in this signal path may differ from those illustrated. For example, the process of receiving the RF television signal typically includes detection, demodulation, and one or more frequency translations. Those processes may be allocated among the tuner 412 and the adapter processor 420 as desired. Further, the processing and output functions can be allocated differently than as illustrated. For example, the tuner 412 and/or audio amplifier 422 may be disposed in the electronic device (as shown by tuner 430 and audio amplifier 432) and the functions performed by the adapter processor 420 may be performed by the electronic device processor 404.

The RF television signals provided by the common conductor 434G are typically very low in power, and it is important that as much of the energy present in the common conductor 434G is provided to the tuner 412 as possible, while rejecting any spurious signals that are not RF television signals. To accomplish this, the adapter 208 uses a matching network to match the impedance of the input to the tuner 412 to the impedance of the output of the common conductor 434G. This is accomplished via a matching network 410 coupled between the common conductor 434G and the tuner 412.

Although digital television broadcasts are more immune to interference than analog television broadcasts in some respects, they are more problematic in other respects, as the reception of digital signals do not gracefully degrade as the signal weakens or interference increases. For example, when an NTSC television signal was weak or subject to multipath, it was often the case that the signal could still be received with adequate clarity for mobile purposes. However, the result of a weak ATSC television signal is often the reception of no signal at all, or an intermittent signal. Accordingly, the matching of the impedance of the tuner 412 and associated circuitry to the common conductor 434G and associated circuitry is of particular importance when the received signal is a digital signal. This is made difficult by the fact that the frequency bands used for television broadcasts are non-contiguous, and span over half of a GHz bandwidth, so the center frequency for those bands may vary significantly.

Under the NTSC standard, analog television was broadcast on channels 2-13 of the very high frequency (VHF) band and 14-83 of the ultra high frequency (UHF) band. The frequency bands allocated to each channel for analog television applications were as follows (in MHz):

TABLE I

Channels 2-6 (VHF Low)

| Channel | Lower edge | Video carrier | ATSC carrier | Audio carrier | Upper edge |
|---|---|---|---|---|---|
| 2 | 54 | 55.25 | 54.31 | 59.75 | 60 |
| 3 | 60 | 61.25 | 60.31 | 65.75 | 66 |
| 4 | 66 | 67.25 | 66.31 | 71.75 | 72 |
| 5 | 76 | 77.25 | 76.31 | 81.75 | 82 |
| 6 | 82 | 83.25 | 82.31 | 87.75 | 88 |

TABLE II

Channels 7-13 (VHF High)

| Channel | Lower edge | Video carrier | ATSC carrier | Audio carrier | Upper edge |
|---|---|---|---|---|---|
| 7 | 174 | 175.25 | 174.31 | 179.75 | 180 |
| 8 | 180 | 181.25 | 180.31 | 185.75 | 186 |
| 9 | 186 | 187.25 | 186.31 | 191.75 | 192 |
| 10 | 192 | 193.25 | 192.31 | 197.75 | 198 |
| 11 | 198 | 199.25 | 198.31 | 203.75 | 204 |
| 12 | 204 | 205.25 | 204.31 | 209.75 | 210 |
| 13 | 210 | 211.25 | 210.31 | 215.75 | 216 |

TABLE III

UHF

| Channel | Lower edge | Video carrier | ATSC carrier | Audio carrier | Upper edge |
|---|---|---|---|---|---|
| 14 | 470 | 471.25 | 470.31 | 475.75 | 476 |
| 15 | 476 | 477.25 | 476.31 | 481.75 | 482 |
| 16 | 482 | 483.25 | 482.31 | 487.75 | 488 |
| 17 | 488 | 489.25 | 488.31 | 493.75 | 494 |
| 18 | 494 | 495.25 | 494.31 | 499.75 | 500 |
| 19 | 500 | 501.25 | 500.31 | 505.75 | 506 |
| 20 | 506 | 507.25 | 506.31 | 511.75 | 512 |
| 21 | 512 | 513.25 | 512.31 | 517.75 | 518 |
| 22 | 518 | 519.25 | 518.31 | 523.75 | 524 |
| 23 | 524 | 525.25 | 524.31 | 529.75 | 530 |
| 24 | 530 | 531.25 | 530.31 | 535.75 | 536 |
| 25 | 536 | 537.25 | 536.31 | 541.75 | 542 |
| 26 | 542 | 543.25 | 542.31 | 547.75 | 548 |
| 27 | 548 | 549.25 | 548.31 | 553.75 | 554 |
| 28 | 554 | 555.25 | 554.31 | 559.75 | 560 |
| 29 | 560 | 561.25 | 560.31 | 565.75 | 566 |
| 30 | 566 | 567.25 | 566.31 | 571.75 | 572 |
| 31 | 572 | 573.25 | 572.31 | 577.75 | 578 |
| 32 | 578 | 579.25 | 578.31 | 583.75 | 584 |
| 33 | 584 | 585.25 | 584.31 | 589.75 | 590 |
| 34 | 590 | 591.25 | 590.31 | 595.75 | 596 |
| 35 | 596 | 597.25 | 596.31 | 601.75 | 602 |
| 36 | 602 | 603.25 | 602.31 | 607.75 | 608 |
| 37 | 608 | 609.25 | — | 613.75 | 614 |
| 38 | 614 | 615.25 | 614.31 | 619.75 | 620 |
| 39 | 620 | 621.25 | 620.31 | 625.75 | 626 |
| 40 | 626 | 627.25 | 626.31 | 631.75 | 632 |
| 41 | 632 | 633.25 | 632.31 | 637.75 | 638 |
| 42 | 638 | 639.25 | 638.31 | 643.75 | 644 |
| 43 | 644 | 645.25 | 644.31 | 649.75 | 650 |
| 44 | 650 | 651.25 | 650.31 | 655.75 | 656 |
| 45 | 656 | 657.25 | 656.31 | 661.75 | 662 |
| 46 | 662 | 663.25 | 662.31 | 667.75 | 668 |
| 47 | 668 | 669.25 | 668.31 | 673.75 | 674 |
| 48 | 674 | 675.25 | 674.31 | 679.75 | 680 |
| 49 | 680 | 681.25 | 680.31 | 685.75 | 686 |
| 50 | 686 | 687.25 | 686.31 | 691.75 | 692 |
| 51 | 692 | 693.25 | 692.31 | 697.75 | 698 |
| 52 | 698 | 699.25 | 698.31 | 703.75 | 704 |
| 53 | 704 | 705.25 | 704.31 | 709.75 | 710 |
| 54 | 710 | 711.25 | 710.31 | 715.75 | 716 |
| 55 | 716 | 717.25 | 716.31 | 721.75 | 722 |
| 56 | 722 | 723.25 | 722.31 | 727.75 | 728 |
| 57 | 728 | 729.25 | 728.31 | 733.75 | 734 |
| 58 | 734 | 735.25 | 734.31 | 739.75 | 740 |
| 59 | 740 | 741.25 | 740.31 | 745.75 | 746 |
| 60 | 746 | 747.25 | 746.31 | 751.75 | 752 |
| 61 | 752 | 753.25 | 752.31 | 757.75 | 758 |
| 62 | 758 | 759.25 | 758.31 | 763.75 | 764 |
| 63 | 764 | 765.25 | 764.31 | 769.75 | 770 |
| 64 | 770 | 771.25 | 770.31 | 775.75 | 776 |
| 65 | 776 | 777.25 | 776.31 | 781.75 | 782 |
| 66 | 782 | 783.25 | 782.31 | 787.75 | 788 |
| 67 | 788 | 789.25 | 788.31 | 793.75 | 794 |
| 68 | 794 | 795.25 | 794.31 | 799.75 | 800 |
| 69 | 800 | 801.25 | 800.31 | 805.75 | 806 |
| 70 | 806 | 807.25 | — | 811.75 | 812 |
| 71 | 812 | 813.25 | — | 817.75 | 818 |
| 72 | 818 | 819.25 | — | 823.75 | 824 |
| 73 | 824 | 825.25 | — | 829.75 | 830 |
| 74 | 830 | 831.25 | — | 835.75 | 836 |
| 75 | 836 | 837.25 | — | 841.75 | 842 |

TABLE III-continued

| | | UHF | | | |
|---|---|---|---|---|---|
| Channel | Lower edge | Video carrier | ATSC carrier | Audio carrier | Upper edge |
| 76 | 842 | 843.25 | — | 847.75 | 848 |
| 77 | 848 | 849.25 | — | 853.75 | 854 |
| 78 | 854 | 855.25 | — | 859.75 | 860 |
| 79 | 860 | 861.25 | — | 865.75 | 866 |
| 80 | 866 | 867.25 | — | 871.75 | 872 |
| 81 | 872 | 873.25 | — | 877.75 | 878 |
| 82 | 878 | 879.25 | — | 883.75 | 884 |
| 83 | 884 | 885.25 | — | 889.75 | 890 |

Note that the frequency bands used for analog transmission were non-contiguous. In particular, VHF low band channels 2-4 occupy 54-72 MHz, while VHF low band channels 5-6 occupy 76-88 MHz. Thus, there is a 4 MHz gap between channel 4 and channel 5. Further, VHF high band channels 7-13 occupy the bandwidth of 174-216 MHz, which means there is a 128 MHz gap between channel 6 and channel 7 (still at least partially occupied by analog FM broadcasts in the 88-108 MHz range).

In the United States, digital television is broadcast according to standards developed by the Advanced Television Systems Committee (ATSC). ATSC standards have been defined for terrestrial and handheld applications (A/53: ATSC Digital Television Standard, Parts 1-6, 2007 and A/153: ATSC Mobile DTV Standard Parts 1-9, 2-9-2011, both of which are hereby incorporated by reference herein). Other sovereigns use the DVB standard (which includes a satellite, terrestrial, cable, and handheld standard).

These digital television broadcasts occupy some of the frequency bands previously assigned to analog television. As shown above, those frequency bands are not contiguous. Hence, although the RF television signals provided to the coupler by the common conductor 434G may be fairly narrow in bandwidth (6 MHz), the center frequency may vary considerably. This problem is especially pernicious with digital television broadcasts, and particularly when reception of digital television signals previously allocated to both the VHF and UHF bands previously allocated to analog television signals.

Accordingly, the adapter 206 includes a first matching network 410A and a second matching network 410B, which are selectably coupled in the signal path between the ground connector 434G and the tuner 412 by a switch 408 controlled by a channel command 413 from the adapter processor 420. In the illustrated embodiment, the first matching network 410A matches the input impedance of the tuner 412 with the output impedance of the switch 408 in a first legacy band (for example, UHF frequencies) while the second matching network 410B matches the input impedance of the tuner 412 with the impedance of the switch 408 in a second legacy band (for example, VHF frequencies). The UHF matching network matches the impedance (frequency dependent resistance) out of the switch 408 to impedance into the UHF filter 410A. Although signals are present in other bands, including the VHF band, the UHF filter will attenuate those signals outside of the UHF band. Hence, when the user selects a digital television channel broadcasting in one of the UHF bands (for example, by selection of a control in the electronic device 202 communicatively coupled to the electronic device processor 404 or by selection of a control communicatively coupled to the adapter processor 420), a control command signal 413 is provided to the switch 408. In response, the switch 408 selectively couples the switch signal input 434 to switch first switch signal output 436A that is communicatively coupled to the UHF matching network 410A. Further, when the user selects a digital television channel broadcasting in one of the VHF bands (via analogous means), a control command signal 413 is provided to the switch 408 to selectively couple the switch signal input 434 to a second switch signal output 436B that is communicatively coupled to the VHF matching network 410B.

FIG. 4 also illustrates the use of optional filter networks 426A and 426B to bandpass filter the output of the matching network to reject frequencies that are not presented on the channel of interest. In the illustrated embodiment, the adapter 206 comprises a first filter network 426A which bandpass filters the signal from the UHF matching network 410A to pass only UHF signals, and a second filter network 426B that filters the signal from the VHF matching network 410B to pass only VHF signals. Although optional, these filters can substantially reduce spurious signals and noise provided to the tuner 412.

The associated matching networks 410 can be modified as necessary to account for the change in the impedance seen looking into the tuner 412 so as to match that impedance with the impedance looking towards the common conductor 434G.

Figure 5:
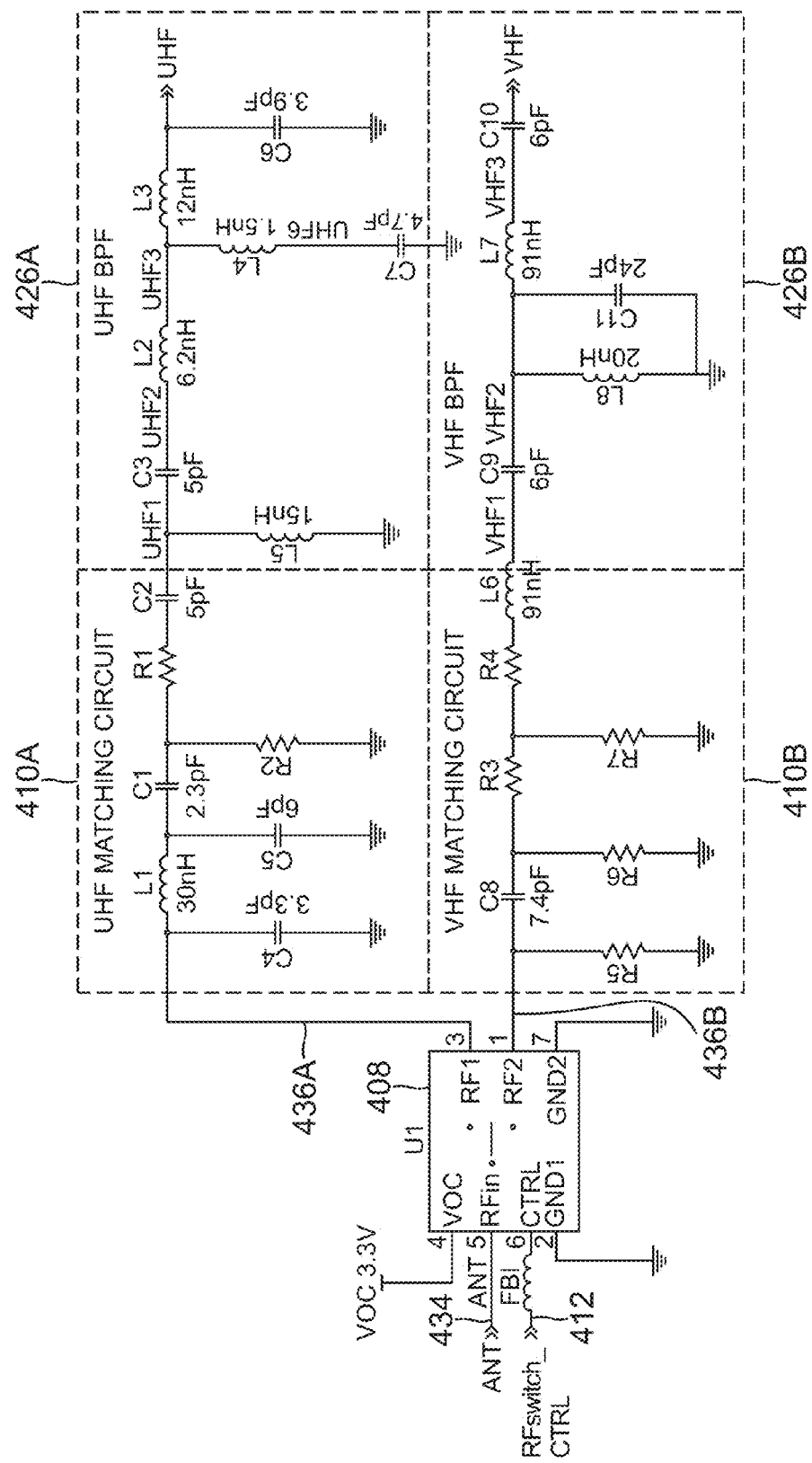
FIG. 5 is a diagram illustrating one embodiment of the matching networks and filters.

FIG. 5 is a diagram illustrating one embodiment of the matching networks and filters. In this embodiment, the UHF matching circuit 410A comprises a first capacitor C4 coupled to the first switch output 436A and to ground and a first end of first inductor L1 coupled to the first switch output 436A. The other end of the first inductor L1 is coupled to ground through capacitor C5 and to a first end of capacitor C1. The other end of capacitor C1 is coupled to ground through resistor R2 and to capacitor C2 through resistor R1. The other end of capacitor C2 is coupled to ground through inductor L5. The UHF filter circuit 426A comprises a capacitor C3 having a first end coupled to the other end of capacitor C2 and a second end coupled to a first end of inductor L2. The second end of inductor L2 is coupled to ground through a series combination of inductor L4 and capacitor C7 and also coupled to the output through inductor L3. The output is also coupled to ground through capacitor C6.

Similarly, the VHF matching circuit 410B comprises a first end of resistor R5 coupled to the second switch output 436B and a second end of resistor R5 coupled to ground. The first end of resistor R5 is coupled to a first end of capacitor C9, and a second end of capacitor C9 is coupled to ground through resistor R6. The second end of capacitor C9 is coupled to first end of resistor R3 and the second end of resistor R3 is coupled to ground through resistor R7 and to a first end of resistor R4. The second end of resistor R4 is coupled to a first end of inductor L6 and the second end of inductor L6 represents the output of the VHF matching circuit 410B. The VHF bandpass filter 426B comprises a first end of capacitor C9 coupled to the second end of inductor L6, and the second end of capacitor C9 coupled to ground via a parallel combination of inductor L8 and capacitor C11. The second end of capacitor C9 is also coupled to the output (and hence, the VHF input of the tuner 412) via a series combination of inductor L7 and capacitor C10.

Isolation circuit 424 is inserted between the audio amplifier 422 and the headset 210 to block RF frequency signals from the audio amplifier 422 while passing audio frequency signals from the audio amplifier 422 to the headset.

Figure 6:
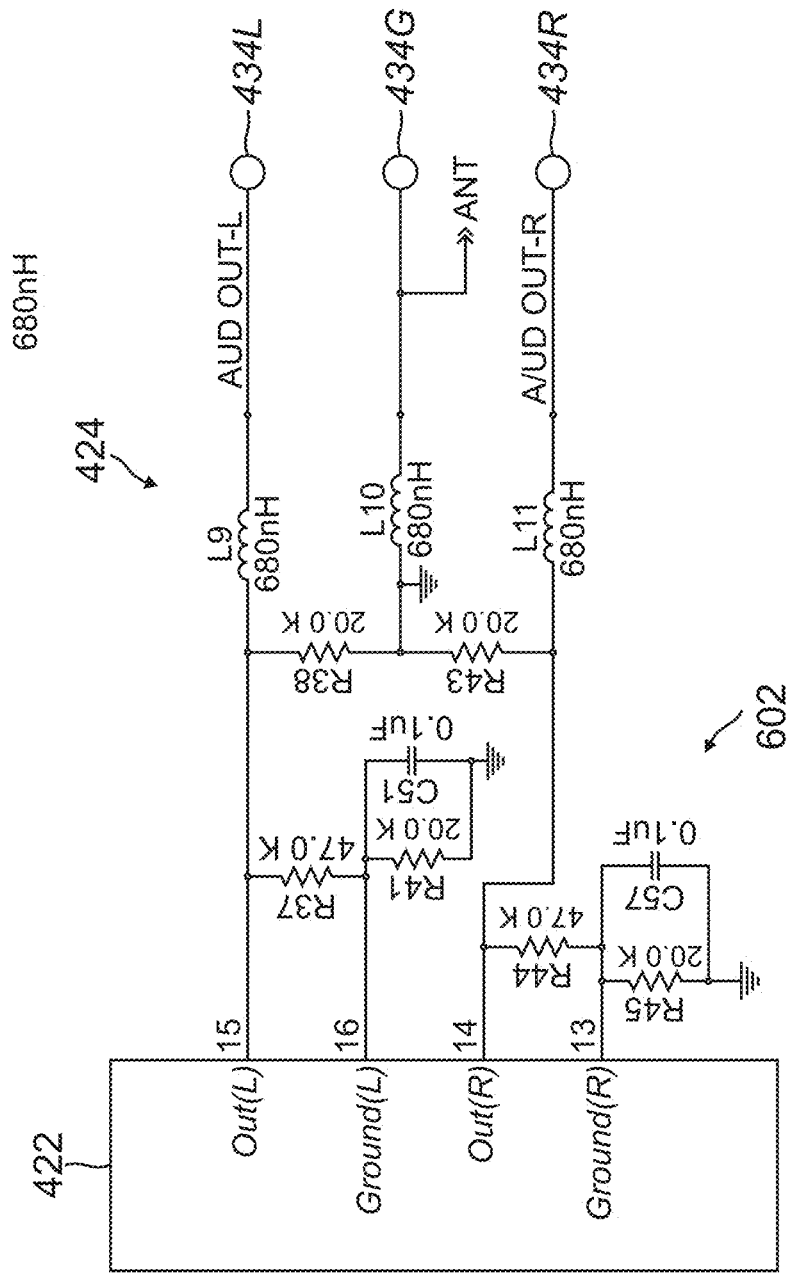
FIG. 6 is a diagram illustrating an exemplary embodiment of the isolation circuit.

FIG. 6 is a diagram illustrating an exemplary embodiment of the isolation circuit 424. In this embodiment, the audio amplifier includes a left output and associated left ground, and a right output and associated right ground. Since the headset 210 includes a single common conductor 434G, balancing network 602 is inserted between the audio amplifier 422 and the isolation network 424. The balancing network 602 comprises first resistor R37 coupled between the amplifier left output and the related left ground, and the left ground coupled to chassis ground via a parallel combination of capacitor C51 and resistor R41. An analogous circuit is coupled to right output. In the illustrated embodiment, the first resistor R37 is a 47 KΩ resistor, the second resistor R41 is a 20 KΩ resistor, and the capacitor C51 is a 0.1 μF capacitor.

The left channel of the isolation network 424 comprises a common conductor 434G coupled to chassis ground through inductor L10. The left signal conductor 434L is also coupled to chassis ground through a series combination of inductor L9 and resistor R38, with the output of the balancing network coupled between inductor L9 and resistor R38. An analogous network used for the right signal conductor 434R as shown in FIG. 6. In the illustrated embodiment, resistor R38 is 20 KΩ, and inductors L9 and L10 are 680 nH inductors.

Figure 7:
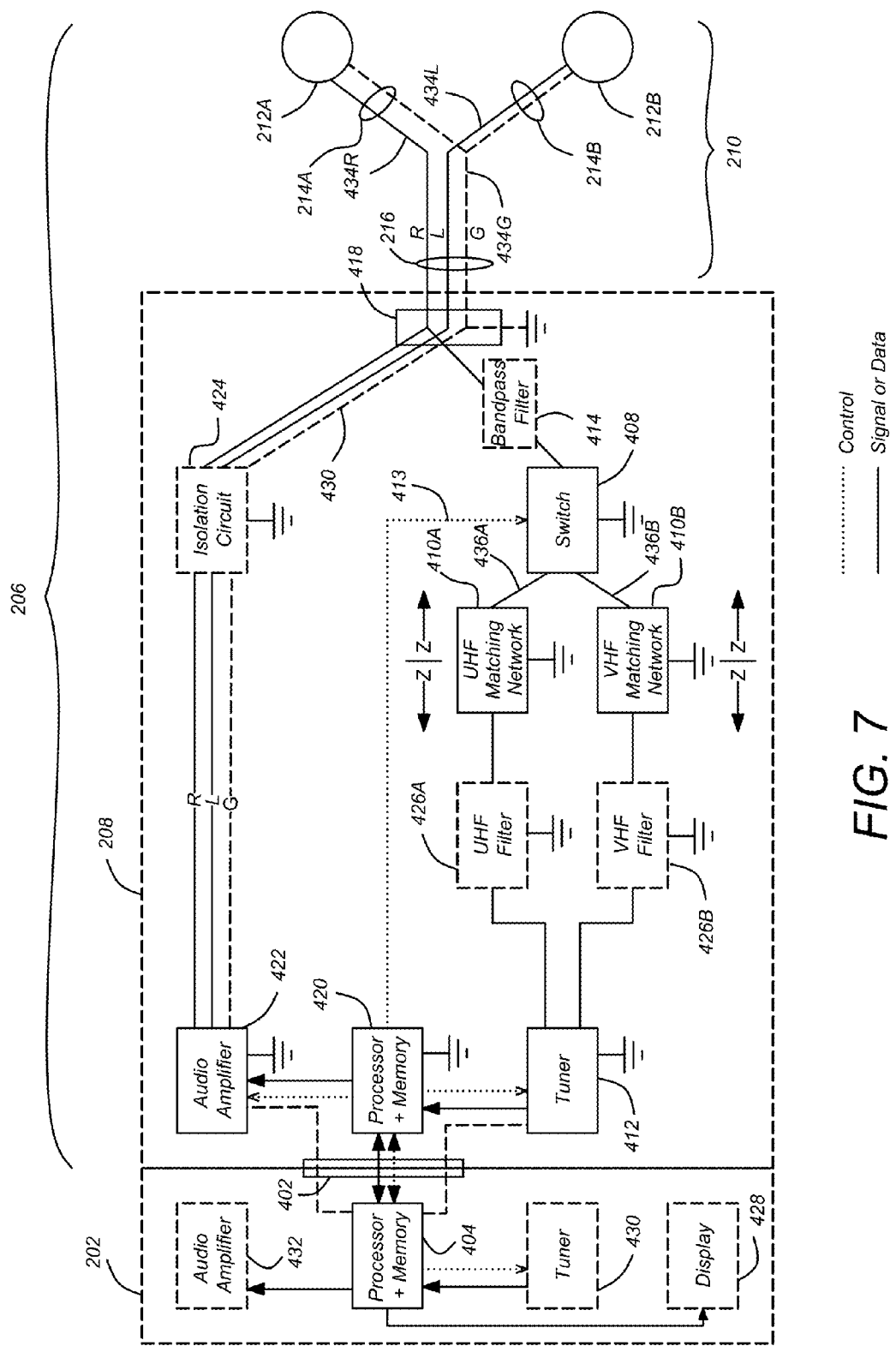
FIG. 7 is a diagram illustrating another embodiment of the adapter.

FIG. 7 is a diagram illustrating another embodiment of the adapter 206. One difficulty with the foregoing designs (which use the common conductor 434G as the antenna) is that the RF television signals can be significantly attenuated when the user touches the adapter 206, because the user can short at least part of the RF television signals to ground. This can be accommodated for in the design of the matching networks 410, or, as described below, can be ameliorated by using one of the signal conductors 434R and 434L for the antenna instead of the common conductor 434G. In the embodiment shown in FIG. 7, one of the signal conductors 434R and 434L are used as the antenna to collect RF television signals. In this embodiment, the common conductor 434G is coupled to a common ground of the adapter 206 either at the plug 418 or at the bandpass filter 414. This prevents the path to ground that may result when the user handles the adapter 206 or electronic device 202.

Although optional filters 426 bandpass filter the signal to reject out of band signals before presenting them to the tuner 412, this configuration may present further difficulties regarding interfering signals. Because the switch 408 is a non-linear device, there the application of audio signals to the switch 408 may create harmonic and intermodulation distortions within the desired band of the RF signals. Accordingly, the embodiment shown in FIG. 7 further comprises a band-pass filter 414, which is used to block undesired emissions that are outside of the VHF or UHF bands that might result in problematic intermodulation products as the input signal passes through the non-linear switch 408. Since this isolation circuit 414 passes RF signals and blocks audio signals, its design may be complimentary to that of the first isolation circuit 424. To further reduce harmonic and intermodulation distortions, the passband of the desired RF signals may be function of the selected channel, control signal 413 may be provided to the isolation circuit as well, so that the RF television frequencies passed by the isolation circuit differ according to the selected channel. Alternatively, the isolation circuit 414 may comprise a plurality of isolation circuits, communicatively coupled between the matching networks 410 and the switch 408.

While only two matching networks 410 and two filters 426 are illustrated in the above embodiments, the present invention can be practiced with a greater number of matching networks and filters. For example, the frequencies devoted to digital television broadcasts may include N non-contiguous frequency bands, and there may be a matching network and filter dedicated for only one of the non-contiguous frequency bands or multiple non-contiguous frequency bands. For example, as shown above, the VHF legacy band includes two sub-bands—a lower VHF band and a non-contiguous upper VHF band. The adapter 206 could be designed to include three matching networks and filters, one for each of the VHF bands and one for the UHF band. Further, the UHF band is broken into a number of non-contiguous sub-bands, and further matching networks and filters may be included for these sub-bands as well.

Figure 8:
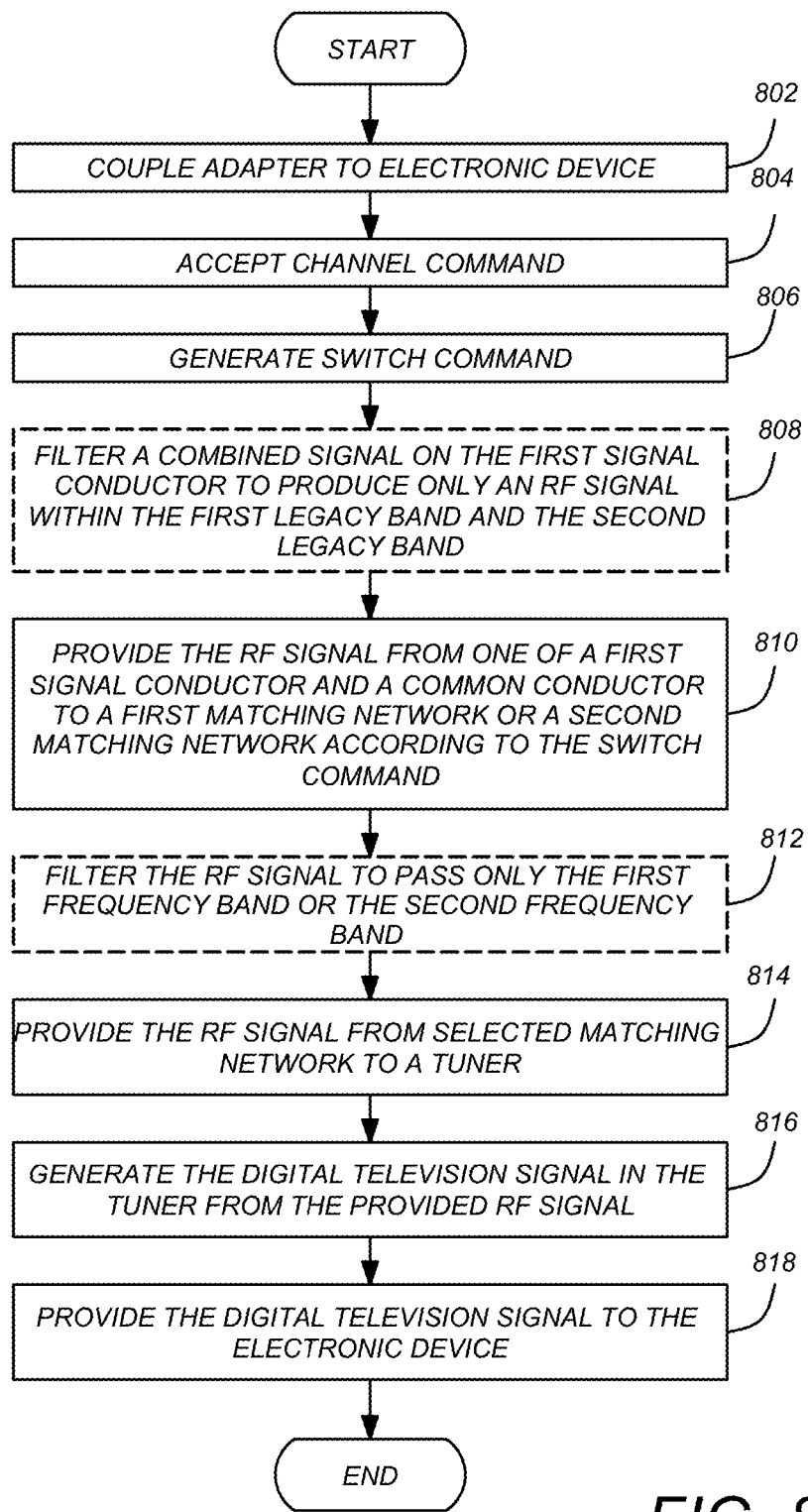
FIG. 8 is a diagram presenting illustrative process steps that can be used to adapt an electronic device to receive digital television broadcast signals.

FIG. 8 is a diagram presenting illustrative process steps that can be used to adapt an electronic device to receive digital television broadcast signals. These steps can be used in conjunction with the hardware embodiments presented in the foregoing figures. Optional steps are indicated by dashed blocks.

Block 802 illustrates the coupling of the adapter 206 to electronic device 202. When coupled, the adapter 206 and electronic device 202 combination can be configured as described in FIGS. 2-7. In optional block 804, a channel command is accepted. Typically, the channel command is a command for the tuner 412 (or 430) to tune a particular digital television broadcast channel. In block 806, a switch command is generated from the channel command. This is typically performed by the adapter processor 420, but may be performed all or in part by the electronic device processor 404. In optional block 808, a combined signal on a first signal conductor (one or both of signal conductors 434R and 434L) are filtered to produce only an RF signal within the first legacy band (e.g. VHF) and/or the second legacy band (e.g. UHF). This step is optional, as it is only required for embodiments in which the signal conductor 434R or 434L is used as the antenna to collect the RF signal, as shown in FIG. 7. In block 810, the RF signal is provided from either a first signal conductor (such as either one or both of signal conductors 434R and 434L) or a common conductor 434G to a first matching network such as 410A or a second matching network 410B according to the generated switch command such as that which is manifested by channel command signal 413. Optionally the RF signal from the matching networks 410 can be filtered to pass only the first legacy frequency band or the second legacy frequency bands, as shown in block 812. The optionally filtered RF signal is then provided to a tuner 412, which generates a digital television signal from the provided RF signal, as shown in blocks 814 and 816. The digital television signal from the tuner 412 is then provided to an electronic device 202, to a display within the adapter 206 or to an external display, as shown in block 818.

Figure 9:
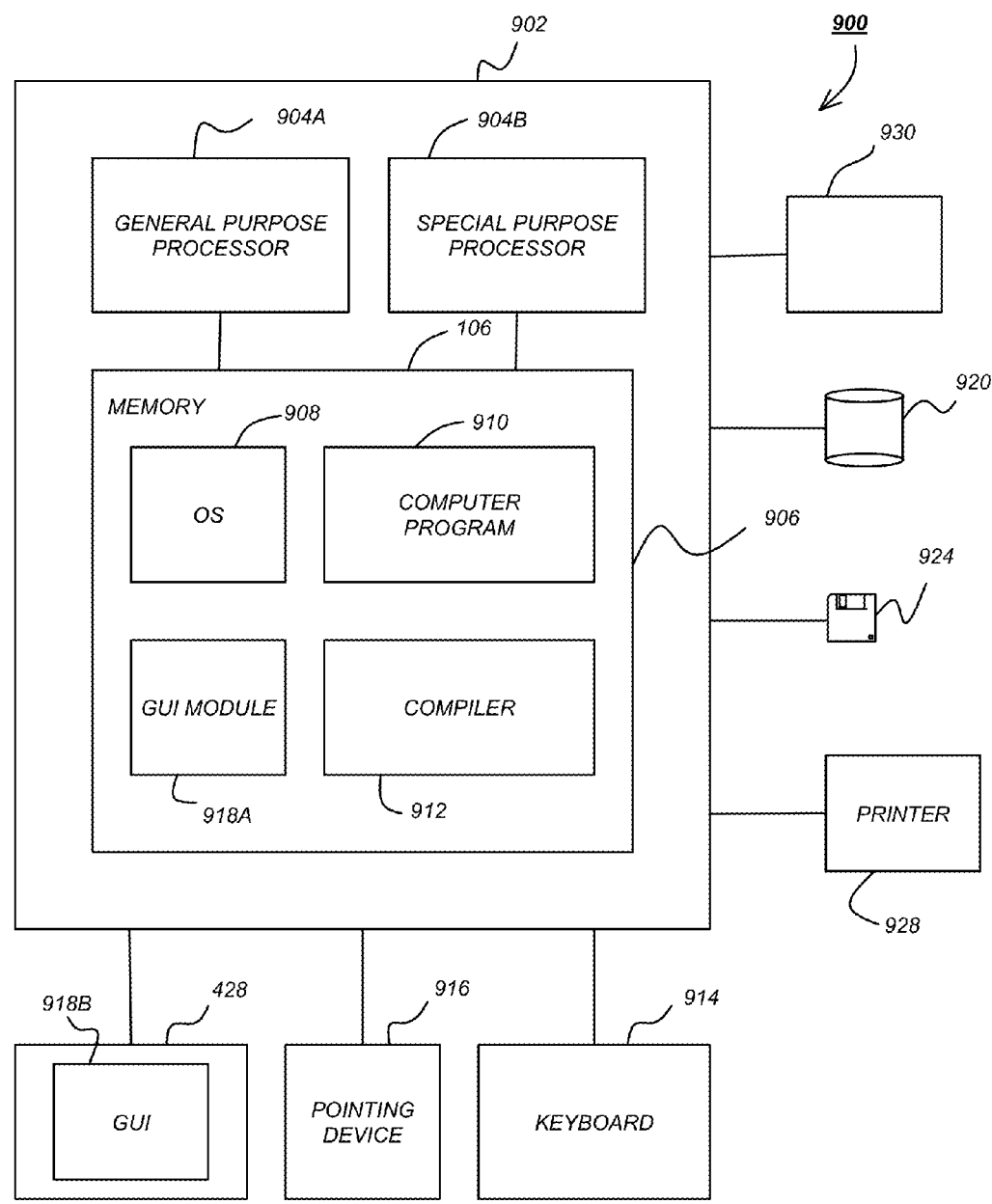
FIG. 9 is a diagram illustrating an exemplary processing system that could be used to implement elements of the present invention, including the electronic device or elements of the adapter.

FIG. 9 is a diagram illustrating an exemplary processing system 900 that could be used to implement elements of the present invention, including the electronic device 202 or elements of the adapter 206. The processing system comprises a computer 902 which may comprise a general purpose hardware processor 904A and/or a special purpose hardware processor 904B (hereinafter alternatively collectively referred to as processor 904) and a memory 906, such as random access memory (RAM). The computer 902 may be coupled to other devices, including input/output (I/O) devices such as a keyboard 914, a mouse device 916 and a printer 928.

In one embodiment, the computer 902 operates by the general-purpose processor 904A performing instructions defined by the computer program 910 under control of an operating system 908. The computer program 910 and/or the operating system 908 may be stored in the memory 906 and may interface with the user and/or other devices to accept input and commands and, based on such input and commands and the instructions defined by the computer program 910 and operating system 908 to provide output and results.

Output/results may be presented on the display 428 or provided to another device for presentation or further processing or action. In one embodiment, the display 428 comprises a liquid crystal display (LCD) having a plurality of separately addressable pixels formed by liquid crystals. Each pixel of the display 428 changes to an opaque or translucent state to form a part of the image on the display in response to the data or information generated by the processor 904 from the application of the instructions of the computer program 910 and/or operating system 908 to the input and commands. Other display 428 types also include picture elements that change state in order to create the image presented on the display 428. The image may be provided through a graphical user interface (GUI) module 918A. Although the GUI module 918A is depicted as a separate module, the instructions performing the GUI functions can be resident or distributed in the operating system 908, the computer program 910, or implemented with special purpose memory and processors. The display 428 may also accept user input. For example, the display 428 may comprise a touch screen.

Some or all of the operations performed by the computer 902 according to the computer program 910 instructions may be implemented in a special purpose processor 904B. In this embodiment, some or all of the computer program 910 instructions may be implemented via firmware instructions stored in a read only memory (ROM), a programmable read only memory (PROM) or flash memory within the special purpose processor 904B or in memory 906. The special purpose processor 904B may also be hardwired through circuit design to perform some or all of the operations to implement the present invention. Further, the special purpose processor 904B may be a hybrid processor, which includes dedicated circuitry for performing a subset of functions, and other circuits for performing more general functions such as responding to computer program instructions. In one embodiment, the special purpose processor is an application specific integrated circuit (ASIC).

The computer 902 may also implement a compiler 912 which allows an application program 910 written in a programming language such as COBOL, C++, FORTRAN, or other language to be translated into processor 904 readable code. After completion, the application or computer program 910 accesses and manipulates data accepted from I/O devices and stored in the memory 906 of the computer 902 using the relationships and logic that was generated using the compiler 912.

The computer 902 also optionally comprises an external communication device such as a modem, satellite link, WiFi link, Ethernet card, cellphone or 4G link, or other device for accepting input from and providing output to other computers.

In one embodiment, instructions implementing the operating system 908, the computer program 910, and/or the compiler 912 are tangibly embodied in a computer-readable medium, e.g., data storage device 920, which could include one or more fixed or removable data storage devices, such as a zip drive, floppy disc drive 924, hard drive, CD-ROM drive, tape drive, or a flash drive. Further, the operating system 908 and the computer program 910 are comprised of computer program instructions which, when accessed, read and executed by the computer 902, causes the computer 902 to perform the steps necessary to implement and/or use the present invention or to load the program of instructions into a memory, thus creating a special purpose data structure causing the computer to operate as a specially programmed computer executing the method steps described herein. Computer program 910 and/or operating instructions may also be tangibly embodied in memory 906 and/or data communications devices 930, thereby making a computer program product or article of manufacture according to the invention. As such, the terms "article of manufacture," "program storage device" and "computer program product" or "computer readable storage device" as used herein are intended to encompass a computer program accessible from any computer readable device or media.

Of course, those skilled in the art will recognize that any combination of the above components, or any number of different components, peripherals, and other devices, may be used with the computer 902.

Although the term "computer" is referred to herein, it is understood that the computer may include portable devices such as cellphones, portable MP3 players, video game consoles, notebook computers, tablet or pocket computers, personal data assistants (PDAs) or any other device with suitable processing, communication, and input/output capability.

CONCLUSION

This concludes the description of the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples, and data provide a complete description of the manufacture and use of the composition of the invention. Since many embodiments of the invention can be made without departing from the spirit and scope of the invention, the invention resides in the claims hereinafter appended.

What is claimed is:

1. An apparatus, configured for communicative coupling between an electronic device and a headset, the electronic device having an electronic device processor to receive a radio frequency (RF) signal within a first legacy band or a second legacy band, and the headset comprising a first sound reproduction device for producing audio according to a first input signal, a second sound reproduction device for producing audio according to a second input signal, a first signal conductor communicatively coupled to a first sound reproduction device input and the first input signal, a second signal conductor communicatively coupled to a second sound reproduction device input and the second input signal, and a common conductor communicatively coupled to a first sound reproduction device ground and a second sound reproduction device ground, the apparatus comprising:

an isolation circuit, coupled between an audio amplifier output and the first sound reproduction device input and the second sound reproduction device input, the isolation circuit for blocking the RF frequency signals from the audio amplifier and passing audio frequency signals from the audio amplifier;
a switch, having a signal input, a switch control input, a first signal output and a second signal output, wherein:
  the signal input is coupled to at least one of the first signal conductor and the common conductor; and
  the switch communicatively couples the signal input to either the first signal output or the second signal output according to the switch control input;
a first legacy frequency band matching network communicatively coupled between the first signal output and a first input of a tuner;
a second legacy frequency band matching network communicatively coupled to the second signal output and a second input of the tuner; and
an adapter processor, communicatively coupled to the switch control input, for generating a switch command according to a channel command received from the device processor;
wherein the first legacy frequency band matching network matches an input impedance of the first tuner input with the output impedance of the switch; and
wherein the second legacy frequency band matching network matches an input impedance of the second tuner input with the output impedance of the switch.

2. The apparatus of claim 1, wherein the signal input of the switch is coupled to the first signal conductor.

3. The apparatus of claim 2, wherein the signal input of the switch is coupled to the common conductor.

4. The apparatus of claim 1, further comprising a bandpass filter, for passing substantially only signals in the first legacy band and the second legacy band.

5. The apparatus of claim 1, wherein the first legacy frequency band matching network comprises a first passive network and the second legacy frequency band matching network comprises a second passive network.

6. The apparatus of claim 1, wherein the adapter is configured for removable coupling to the electronic device.

7. An apparatus, configured for communicative coupling to an electronic device and a headset, the electronic device having an electronic device processor to adapt the electronic device to receive a signal within a first legacy frequency band or a second legacy frequency band and the headset comprising a first sound reproduction device coupled to a first signal conductor and a common conductor, the adapter comprising:
  an audio amplifier, coupled to the first sound reproduction device via the first signal conductor;
  a switch, coupled between one of the first signal conductor or the common conductor and a tuner, the switch for selectably coupling the one of the first signal conductor or the common conductor to the tuner via one of a plurality of networks comprising a first network and a second network according a switch command; and
  wherein the first network matches a first output impedance into the switch to an input impedance of the tuner over the first legacy frequency band; and
  wherein the second network matches a second output impedance of the switch to the input impedance of the tuner over the second legacy frequency band.

8. The apparatus of claim 7, further comprising:
an isolation circuit, for passing audio frequency signals from the audio amplifier to the first sound reproduction device and for blocking radio frequency signals from the audio amplifier.

9. The apparatus of claim 7, further comprising:
a bandpass filter, for blocking the audio frequency signals from the switch and for passing the first frequency band and the second frequency band.

10. The apparatus of claim 9, wherein the bandpass filter passes substantially only the first legacy frequency band and the second legacy frequency band.

11. The apparatus of claim 7, wherein:
the first network further comprises:
  a first network bandpass filter communicatively coupled to the tuner; and
  a first matching network, communicatively coupled to the first network bandpass filter and the switch, for matching the output impedance of the switch to the input impedance of the first network band-pass filter and the tuner;
the second network further comprises:
  a second network bandpass filter communicatively coupled to the tuner; and
  a second matching network, communicatively coupled to the second network bandpass filter and the switch, for matching the output impedance of the switch to the input impedance of the second network bandpass filter and the tuner.

12. The apparatus of claim 7, wherein the adapter comprises the tuner.

13. The apparatus of claim 12, further comprising an adapter processor, communicatively coupled to the switch, for generating a switch command to selectably couple the one of the first signal conductor or the common conductor to the tuner according to a channel command from the electronic device processor.

14. The apparatus of claim 13, wherein the first sound reproduction device is further coupled to an adapter ground via the common conductor.

15. The apparatus of claim 14, wherein the electronic device comprises a ground isolated from the common conductor.

16. The apparatus of claim 7, wherein the adapter is configured for removable coupling to the electronic device via a docking connector, thereby communicatively coupling the adapter processor to the electronic device processor.

17. The apparatus of claim 7, wherein:
the first legacy frequency band comprises at least a portion of the ultra high frequency (UHF) band; and
the second legacy frequency band comprises at least a portion of the very high frequency (VHF) band.

18. The apparatus of claim 17, wherein:
the second legacy frequency band comprises a plurality of non-contiguous second legacy frequency sub-bands; and
a second network comprises a plurality of second sub-networks, each of the second sub-networks matching an input impedance of the switch to the input impedance of the tuner over an associated second legacy frequency sub-band.

19. The apparatus of claim 7, wherein the device is configured for removable coupling to the electronic device.

20. A method of adapting an electronic device to receive a radio frequency (RF) signal within a first legacy frequency band and a second legacy frequency band, the method comprising the steps of:
  accepting a channel command from the electronic device in an adapter configured to be communicatively coupled to the electronic device, the adapter having a headset comprising a first sound reproduction device coupled to a first signal conductor and to a common conductor;

providing the RF signal from one of the first signal conductor and the common conductor to a first matching network or a second matching network, the application of the RF signal to the first matching network or the second matching network selected according to the channel command;

providing the RF signal from the selected matching network to a tuner;

wherein the first network matches a first impedance out of the one of the first signal conductor and the common conductor to a first impedance into the tuner over the first legacy frequency band; and wherein the second network matches the first impedance out of the one of the first signal conductor and the common conductor to a first impedance into the tuner over the second legacy frequency band.

21. The method of claim 20, further comprising the steps of:

generating a received signal in the tuner from the provided RF signal; and providing the received signal to the electronic device.

22. The method of claim 20, wherein the adapter comprises an adapter processor and a switch, and the step of providing the RF signal to one of the matching networks comprises the steps of:

generating a switch command at least in part from the accepted channel command to generate a switch command; and providing the switch command to a switch communicatively coupled to the one of the first signal conductor and the common conductor and the first matching network and the second matching network.

23. The method of claim 20, further comprising the step of filtering the RF signal to pass only the first legacy frequency band or only the second frequency legacy band according to the switch command.

24. The method of claim 22, wherein the one of the first signal conductor and the common conductor consists of the first signal conductor, and the method further comprises the steps of:

filtering the RF signal from the first signal conductor to produce only an RF signal within the first legacy band and the second legacy band; and providing the filtered RF signal to the switch.

25. The method of claim 20, wherein the device is configured for removable coupling to the electronic device.

* * * * *